United States Patent [19]
Webster et al.

[11] Patent Number: 5,492,263
[45] Date of Patent: Feb. 20, 1996

[54] METHOD FOR WIRE BONDING AN ALUMINUM WIRE TO A LEAD OF AN ELECTRONICS PACKAGE

[75] Inventors: Mark E. Webster; John A. Hearn, both of Kokomo; Daniel R. Bellus, Sharpsville; Steven M. Stansberry, Elwood; Steven A. Middleton, Cicero; Ronald D. Myer, Kokomo, all of Ind.; Gregory L. Hall, Azle, Tex.

[73] Assignee: Delco Electronics Corp., Kokomo, Ind.

[21] Appl. No.: 250,758

[22] Filed: May 26, 1994

[51] Int. Cl.$^6$ .................................................. B23K 20/10
[52] U.S. Cl. ................ 228/111; 228/262.3; 428/652; 427/438; 205/258
[58] Field of Search ................................. 228/111, 262.3, 228/262.5; 428/652; 427/438; 205/258

[56] References Cited

U.S. PATENT DOCUMENTS

| | | | |
|---|---|---|---|
| 3,129,502 | 4/1964 | Olson | 427/438 |
| 3,875,652 | 4/1975 | Arnold et al. | 228/111 |
| 3,953,624 | 4/1976 | Arnold | 427/438 |
| 4,160,049 | 7/1979 | Narcus | 427/438 |

FOREIGN PATENT DOCUMENTS 54-34678  3/1979  Japan.

*Primary Examiner*—P. Austin Bradley
*Assistant Examiner*—Jeffrey T. Knapp
*Attorney, Agent, or Firm*—Mark A. Navarre

[57] ABSTRACT

A method is provided for wire bonding an aluminum wire to a surface of a lead of an electronics package. The method entails a nickel plating process and an ultrasonic bonding process which together cooperate to form a reliable and highly repeatable joint between the wire and the lead member. The ultrasonic bonding process is specifically tailored to the nickel plating produced by the plating process, so as to significantly enhance the bond strength of the resulting ultrasonic bond joint. The plating process is devised to produce a nickel plating which is thicker than that generally practiced, and whose surface is characterized as having a relatively smooth microfinish which unexpectedly serves to enhance the bond strength of the ultrasonic bond joint.

6 Claims, 1 Drawing Sheet

METHOD FOR WIRE BONDING AN ALUMINUM WIRE TO A LEAD OF AN ELECTRONICS PACKAGE

The present invention generally relates to direct wire bonding techniques which are used to electrically interconnect the leads of an electronics package with the electronic circuitry in which the electronics package is to operate. More particularly, this invention relates to an improved wire bonding process involving a plating process and an ultrasonic bonding process which are tailored to synergistically enhance the bond strength of the wire-to-lead bond joint.

BACKGROUND OF THE INVENTION

Hybrid integrated circuits used in automotive applications often employ surface-mounted integrated circuit packages. Such packages are typically electrically interconnected with their respective conductors on the substrate of the hybrid integrated circuit using wire bonding techniques, in which a very thin electrically-conductive wire, often on the order of up to about 0.3 millimeters in diameter, is bonded from the lead of the package and to a bond pad, which may be a thick film conductor or a bond pad which is soldered to the corresponding conductor. Bond pads serve to promote a durable and reliable bond between the wire, which is typically an aluminum alloy, and the conductor, which is typically formed from a different material than that of the wire, such as silver or its alloys and copper or its alloys.

In the past, suitable bonds between the leads of a package and the wire have been achieved with various bonding techniques, including soldering, thermosonic bonding, and ultrasonic bonding. Ultrasonic bonding techniques are advantageous in that fluxes and filler metals are not required, an electric current is not employed at the bond site, and melting of the members being joined does not occur. Instead, the lead and wire contact each other with a known force, and high frequency vibrations are transmitted through a bond tool to the wire, such that the wire and lead oscillate relative to each other in a plane parallel to their surfaces forming the bond interface. As such, only localized heating occurs between the wire and lead, and at levels which do not exceed the melting temperature of either the wire or lead. A bond joint is formed due to the shear stresses generated in the bond interface, which leads to elastic hysteresis, localized slip and plastic deformation of the contacting surfaces, such that surface films are disrupted and metal-to-metal contact is achieved.

While ultrasonic bonding techniques are used for the purpose of bonding thin aluminum wires to the leads of electronic packages, bonds having insufficient strength occur under mass production conditions. Resulting scrappage rates can be relatively high, depending on the particular application and the materials involved. To promote the compatibility of the aluminum wire and the package lead, which is often a pin or part of a leadframe formed from a nickel-base alloy, the package lead is often nickel plated.

For the purpose of enhancing the strength of the ultrasonic bond joint, conventional wisdom is to produce the nickel plating with a relatively rough microfinish. As used herein, a rough microfinish is generally characterized by grains and/or grain boundaries being visible under magnification, such that the plating surface has a dull or matte appearance. Yet, such techniques may still result in scrappage rates on the order of 25 percent or more in mass production, and may produce bonds which have significantly reduced reliability.

Thus, it would be desirable to enhance the integrity of ultrasonic bonds formed between the leads of an electronics package and its corresponding wires. A suitable solution would not significantly complicate the manufacturing or handling of the electronic package, yet be highly repeatable and reliable when used in mass production, particularly for the manufacture of electronic assemblies for the automotive industry.

SUMMARY OF THE INVENTION

It is an object of this invention to provide a method for joining fine aluminum wires to the leads of an electronics package, in which an ultrasonic bonding technique is used to form a reliable and highly repeatable joint between the wires and the leads.

It is another object of this invention that such a method further involve a plating process which produces a bonding surface on each of the leads that, in conjunction with the ultrasonic bonding operation, significantly enhances the strength of the resulting ultrasonic bond joint.

It is a further object of this invention that such a plating process produce a thick nickel plating whose surface is characterized as having a relatively smooth microfinish.

In accordance with a preferred embodiment of this invention, these and other objects and advantages are accomplished as follows.

According to the present invention, there is provided a method for wire bonding an aluminum wire to a surface of a lead of an electronics package. The method entails a nickel plating process and an ultrasonic bonding process which together cooperate to form a reliable and highly repeatable joint between the wire and the lead member. The ultrasonic bonding process is specifically tailored for bonding aluminum wires of up to about 0.30 millimeters in diameter to the nickel plating produced by the plating process, so as to significantly enhance the strength of the resulting ultrasonic bond joint. The plating process is designed to produce a nickel plating which is thicker than that generally practiced, and whose surface is characterized as having a relatively smooth microfinish which, contrary to conventional wisdom, has been unexpectedly found to enhance the strength of the ultrasonic bond joint.

The method of this invention generally involves plating the surface of a package lead so as to form a nickel layer having a thickness of about 7.6 to about 11.4 micrometers. The plating step is conducted with a bath having a high grain refiner content, such as about eight to about twelve volume percent phosphorus. The plating step can be an electroless plating process or an electrolytic plating (electroplating) process conducted at a high current density. The high grain refiner content ensures that the nickel layer will have a generally amorphous microstructure and a smooth microfinish, which results in the nickel layer having a visibly reflective appearance.

In accordance with this invention, a smooth microfinish signifies the absence of visible grains and/or grain boundaries at the surface of the plating when examined under appropriate magnification, a condition which would otherwise contribute a dull or matte appearance to the plating surface.

An aluminum wire is then ultrasonically bonded to the nickel layer. In accordance with this invention, the process parameters of the ultrasonic bonding process are specifically tailored for the nickel plating layer produced by the above plating step. Such process parameters include a fixed frequency of about 60,000 hertz (Hz), a bonding force of about 4.9 to about 7.8 newtons, and a duration of about 50 to about 150 milliseconds. The method of this invention produces a wire bond which is significantly stronger and more reliable than wire bonds produced by prior art methods. Notably, the strength of the bond is such that the wire will tend to fracture before the ultrasonic bond joint will separate.

Therefore, an advantage of the method of this invention is that the reliability of an electronics circuit is significantly enhanced if its electronics packages are wire bonded to their corresponding wires in accordance with this method. As a result, scrap costs can be significantly reduced and machine throughput can be increased to enhance processing efficiency.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

A method is provided for wire bonding an aluminum wire to a lead of a surface mount integrated circuit (IC) package, so as to significantly enhance the reliability of the bond joint between the lead and the wire. As such, the method is particularly applicable to hybrid integrated circuits used in automotive applications, which often employ surface mount IC packages such as microaccelerometers that sense deceleration for the purpose of deploying a supplementary inflatable restraint in an automobile.

Figure 1:
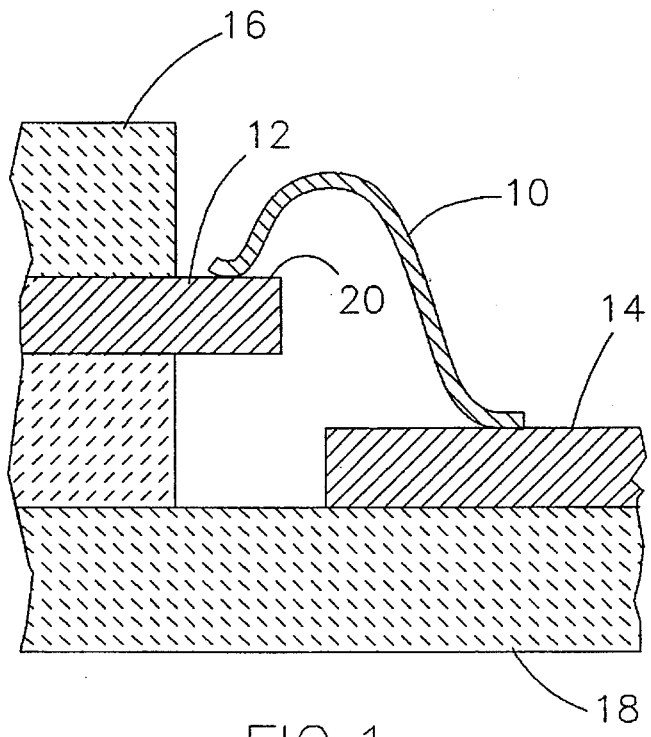
FIGS. 1 and 2 are cross-sectional views of electronics assemblies of the type for which the method of this invention is suited.
Figure 2:
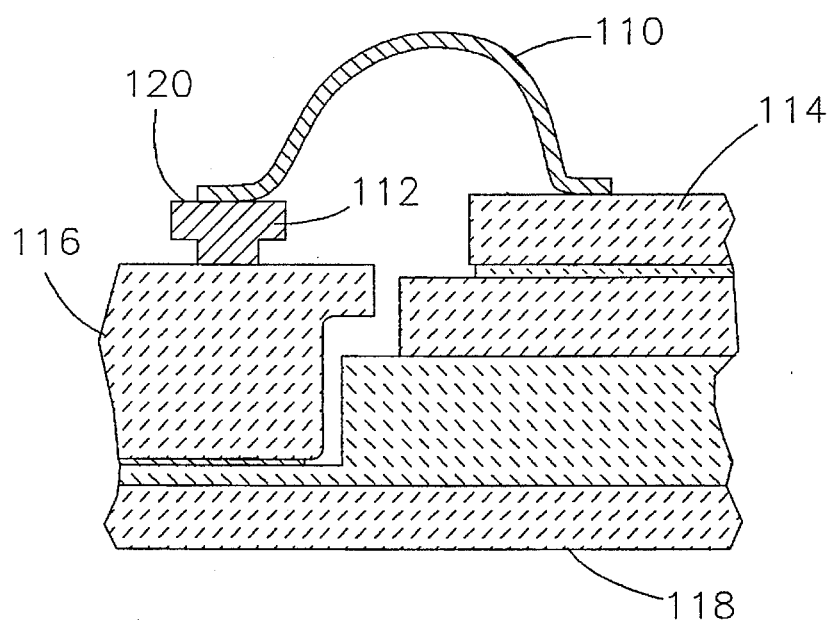

As illustrated in FIG. 1, a housing 16 is shown to be electrically interconnected with a hybrid IC chip 14 mounted to the backplate 18 of a hybrid integrated circuit using direct wire bonding techniques, in which a thin aluminum wire 10, typically on the order of about 0.25 millimeters in diameter, is bonded to the leadframe 12 of the housing 16 and to the chip 14. A variation of the above is illustrated in FIG. 2, in which a pin 112 serves as the lead for an IC package 116. Again, a thin aluminum wire 110 serves to electrically interconnected the package 116 with a hybrid IC chip 114 mounted to the backplate 118 of a hybrid integrated circuit. The wire 110 is bonded to the pin 112 and the chip 114 using direct wire bonding techniques.

In accordance with this invention, the reliability of the bond joint between the wire 10, 110 and the leadframe 12 or pin 112 is promoted by forming an appropriate nickel plating 20, 120 on the leadframe 12 or pin 112, respectively, and then ultrasonically bonding the aluminum wire 10, 110 to the nickel plating 20, 120.

Particularly, it has been determined that the primary factors which enhance the bond include the thickness of the nickel plating 20, 120, the surface finish of the nickel plating 20, 120, which results from the microstructure of the plating 20, 120 being advantageously effected by the plating process, and close tailoring of the ultrasonic bonding process in order to exploit the physical characteristics of the nickel plating 20, 120 so as to achieve a strong and highly reliable bond joint.

Most notably, the nickel plating 20, 120 of this invention is contrary to conventional practices, which generally teach that a rougher surface finish will result in a stronger bond with the wire. However, in accordance with this invention, it has been unexpectedly determined that significantly stronger and more reliable wire bond joints were achieved with nickel plating having a generally amorphous microstructure and a relatively smooth microfinish, which results in the nickel plating 20, 120 having a visibly reflective appearance.

In accordance with this invention, a smooth microfinish corresponds to the absence of visible grains and/or grain boundaries at the surface of the nickel plating 20, 120 when examined under magnification on the order of about 1000× or greater. The presence of visible grains and/or grain boundaries would otherwise contribute a dull or matte appearance to the surface of the nickel plating.

The plating method of this invention entails an electroless or electrolytic nickel plating technique. Either of these techniques may be more appropriate for a given application, depending in part on the geometry of the part to be plated. Generally, an electrolytic plating technique is suitable for plating the leadframe 12 of FIG. 1, while an electroless plating technique is preferable for the pin 112 of FIG. 2, as a result of the smaller size of the pin 112.

As is known in the art, the ability to obtain a relatively uniform plating layer using an electroplating process is complicated by geometries which tend to concentrate the flux of the solution along edges of the part being plated. If an electrolytic process is employed, a relatively high flux density is desirable. With either technique, it is important that the plating bath contain a high grain refiner content which provides a greater number of grain nucleation sites during deposition of the nickel, and thereby yields a finer grained nickel plating 20, 120. Generally, a phosphorus content of about 8 to about 12 volume percent in the plating bath is preferred, though it is possible that other grain refiners might be used.

The object of the plating process is to produce a nickel plating 20, 120 having a thickness of about 7.6 to about 11.4 micrometers, and having the microstructure and appearance described above. In that various plating techniques are available and known to those skilled in the art, and numerous variations are possible by which the preferred nickel plating might be achieved, the plating process of this invention need not and will not be discussed in further detail.

Following the plating process, the leadframe 12 or pin 112 is appropriately assembled with the IC package 16 or 116 in a manner known in the art, and the IC package 16, 116 is then positioned on the backplate 18, 118. An aluminum wire 10, 110 of the type used in direct wire bonding techniques is then ultrasonically bonded to the nickel-plated leadframe 12 or pin 112, as will be explained below.

As is known to those skilled in the art, conventional wire bonding techniques attach one end of a wire to a bond site formed by the lead of an electronics package or a bond site formed by a conductor, and then dispenses the wire as it travels to the corresponding wire bond site, at which the opposite end of the wire is secured. In the process of the present invention, the wire 10, 110 is ultrasonically bonded to the lead 12 or pin 112. The process parameters of the ultrasonic bonding technique of this invention are specifically tailored for the nickel plating layer 20, 120 produced by the above plating step. In a generally conventional manner, the leadframe 12 or pin 112 and the wire 10, 110 contact each other under a known force, and high frequency vibrations are transmitted through a bonding tool such that the wire and leadframe or pin oscillate relative to each other in a plane parallel to their surfaces forming the bond interface. As a result, only localized heating occurs, and a bond joint is formed due to the shear stresses generated in the bond interface.

In accordance with this invention, the bonding power, bonding tool force, and bonding duration must be specifically tailored to complement the nickel plating 20, 120 generated on the leadframe 12 or pin 112, as described above. Preferred process parameters include a fixed frequency of about 60,000 Hz, a bonding force of about 4.9 to about 7.8 newtons, and a bonding duration of about 50 to about 150 milliseconds. The bonding power level can then be readily adjusted to achieve adhesion between the wire and leadframe 12 or pin 112 without producing an overbond, in which the wire is excessively deformed. In practice, suitable results have been achieved by employing the above settings using an Orthodyne Electronics Model 360B bonder set at a bonding power of about 90 to about 150. Those skilled in the art will recognize that the bonding power setting is dependent on the particular type of ultrasonic bonding equipment used and the power of its ultrasonic horn. Therefore, the optimal bonding power setting for the ultrasonic bonding process of this invention will likely vary when other makes and models of bonding equipment is used. However, with the benefit of the specified parameters noted above, those skilled in art will be readily able to duplicate the results of this invention without undue experimentation.

Quite unexpectedly, the above-described method of this invention produces a wire bond which is significantly stronger and more reliable than wire bonds produced by prior art methods. Notably, the strength of the bond is such that the wire will tend to fracture before the ultrasonic bond joint will separate. Testing performed to evaluate the method of this invention is reported below, in which the test variables were the thickness of the nickel plating 20, 120 and the grain refiner content of the plating bath. Pins 112 having a plating thicknesses of between about 3.8 and about 5.1 micrometers were compared against pins 112 having a plating thicknesses within the range prescribed by this invention—about 7.6 to about 8.9 micrometers. Within each group of pins, some were electrolessly plated in a bath having a lower grain refiner content, on the order of about 5 to about 8 volume percent, while others were electrolessly plated in a bath having a higher grain refiner content, on the order of about 8 to about 12 volume percent.

Aluminum wires having a diameter of about 0.25 millimeters were then ultrasonically bonded to each of the pins using an Orthodyne Electronics Model 360B bonder set at the following process conditions: a bonding power of about 105, a bonding force of about 6.9 newtons, and a bonding duration of about 100 milliseconds. Pull tests were then performed on each of the pins until separation of the pin with the wire occurred, either by fracture of the wire or separation at the bond site. The results were as follows:

TABLE I

| Group | Plating thickness (micrometers) | Grain Refiner Content | % Separation At the Bond |
|---|---|---|---|
| A | 3.8–5.1 (low) | 5–8 (low) | 29% |
| B | 3.8–5.1 (low) | 8–12 (high) | 20% |
| C | 7.6–8.9 (high) | 5–8 (low) | 94% |
| D | 7.6–8.9 (high) | 8–12 (high) | 1% |

The Group B and D specimens—i.e., those plated using a high grain refiner content—generally produced the amorphous microstructure and relatively smooth microfinish described above, yielding a visibly reflective plating surface. In contrast, the Group A and C specimens plated using a low grain refiner content generally produced plating surfaces characterized by visible grains and grain boundaries, yielding a relatively rough microfinish having a dull and matte appearance.

The specimens of Groups A and B performed similarly in terms of the number separating at the bond joint and the load at which separation occurred. Generally, the Group A and B specimens separated under a load of about 6.9 to about 10.8 newtons, and predominantly at a load of about 9.8 newtons. These results tended to indicate the influence that plating thickness has on the integrity of the bond.

The Group C specimens performed poorly in comparison to those of Group A and B, with nearly 80 percent separating under loads of only about 3.9 to about 9.8 newtons, and over 20 percent separating under a load of no more than about 1 newton as a result of inadequate bonds. In view of the results of Group A, in which a similar level of grain refiner was used, these results seemed to suggest an adverse effect with greater plating thicknesses.

However, the specimens of Group D performed significantly better than any of the other specimens evaluated. Separation occurred within a relatively narrow load range of about 7.8 to about 11.8 newtons, and predominantly at a load of about 10.8 newtons. The results represented by Group D demonstrated the strong interdependency of the plating thickness with grain refinement during plating, and suggested that greater plating thickness in combination with increased grain refinement was necessary to optimize the strength of the bond joint. Subsequent tests verified that similar results to those of Group D were achieved with plating thicknesses of up to about 11.4 micrometers.

In view of the above, it is apparent that a significant advantage of the method of this invention is that the reliability of an electronics circuit is significantly enhanced by a more reliable and stronger wire bond between the leads of an electronics package and their corresponding wires. Importantly, the manner in which the enhanced wire bond is produced is contrary to conventional beliefs, which generally hold that a rougher surface finish encourages a stronger and more reliable bond. However, to the contrary, the results produced by this invention strongly illustrate that, within specific plating and ultrasonic bonding conditions, significantly greater wire bond reliability can be achieved.

While our invention has been described in terms of a preferred embodiment, it is apparent that other forms could be adopted by one skilled in the art; for example, by modifying some of the processing parameters, or by substituting appropriate materials. Accordingly, the scope of our invention is to be limited only by the following claims.

The embodiments of the invention in which an exclusive property or privilege is claimed are defined as follows:

1. A method for wire bonding an aluminum wire to a surface of an electrical lead, said method comprising the steps of:

plating said surface so as to form a nickel layer having a thickness of about 7.6 to about 11.4 micrometers, said plating step being conducted with a high grain refiner content of about eight to about twelve percent phosphorus, such that said nickel layer has a reflective surface as a result of having a smooth microfinish; and ultrasonically bonding said aluminum wire to said nickel layer, wherein process parameters of said ultrasonic bonding process include a bonding force of about 4.9 to about 7.8 newtons, a duration of about 50 to about 150 milliseconds, and a bonding power level which is sufficient to ultrasonically bond the aluminum wire to the nickel layer.

2. A method as recited in claim 1 wherein said plating step is an electroless plating process.

3. A method as recited in claim 1 wherein said plating step is an electrolytic plating process.

4. A method for wire bonding an aluminum wire to a lead of an electronics package so as to electrically interconnect said electronics package with a conductor of an electronics circuit, said method comprising the steps of:

electrolessly plating a surface of said lead so as to form a nickel layer having a thickness of about 7.6 to about 11.4 micrometers, said plating step being conducted with a high grain refiner content of about eight to about twelve percent phosphorus, such that said nickel layer has a reflective surface as a result of having a smooth microfinish; and ultrasonically bonding said aluminum wire to said nickel layer, wherein process parameters of said ultrasonic bonding step include a frequency of about 60,000 hertz, a bonding force of about 4.9 to about 7.8 newtons, a duration of about 50 to about 150 milliseconds, and a bonding power level which is sufficient to ultrasonically bond the aluminum wire to the nickel layer.

5. A method as recited in claim 4 wherein said aluminum wire has a diameter of no more than about 0.3 millimeters.

6. A method as recited in claim 4 wherein said lead is formed from a nickel-base alloy.

* * * * *